United States Patent [19]
Knauer

[11] Patent Number: 5,382,844
[45] Date of Patent: Jan. 17, 1995

[54] LOGIC CIRCUIT FOR ASYNCHRONOUS CIRCUITS WITH N-CHANNEL LOGIC BLOCK AND P-CHANNEL LOGIC BLOCK INVERSE THERETO

[75] Inventor: Karl Knauer, Grafing, Germany

[73] Assignee: Siemens Aktiengesellschaft, Munich, Germany

[21] Appl. No.: 146,061

[22] PCT Filed: May 5, 1992

[86] PCT No.: PCT/DE92/00366
    § 371 Date: Nov. 3, 1993
    § 102(e) Date: Nov. 3, 1993

[87] PCT Pub. No.: WO92/20156
    PCT Pub. Date: Nov. 12, 1992

[30] Foreign Application Priority Data
    May 8, 1991 [DE] Germany ............... 4115081

[51] Int. Cl.⁶ .......................................... H03K 19/20
[52] U.S. Cl. ...................... 326/95; 326/112; 326/21
[58] Field of Search ................. 307/451–452, 307/443, 455, 481

[56] References Cited

U.S. PATENT DOCUMENTS

| | | | |
|---|---|---|---|
| 4,700,086 | 10/1987 | Ling et al. | 307/452 |
| 5,117,133 | 5/1992 | Luebs | 307/452 |
| 5,258,666 | 11/1993 | Furuki | 307/452 |
| 5,272,397 | 12/1993 | Chen et al. | 307/452 |

FOREIGN PATENT DOCUMENTS

0147598  7/1985  European Pat. Off. .

OTHER PUBLICATIONS

"Design of Clock-Free Asynchronous Systems for Real-Time Signal Processing" by T. Meng et al, Digest of Technical Papers, IEEE ICCAD, (1989), pp. 2532–2535.

Primary Examiner—Edward P. Westin
Assistant Examiner—Andrew Sanders

[57] ABSTRACT

A logic circuit for asynchronous circuits, in which logic circuit signals which are present at the input (in) of the logic circuit can be linked both in a first logic block (NL) and also in a second logic block (PL) inverse thereto, and in which logic circuit, at a complete message output (cmpl), a signal can be formed to report valid data at an output (out) of the logic circuit, by a logic link (E), from signals from outputs of both logic blocks. In order to achieve a greater interference resistance and a lower power loss with the simultaneous use of conventional CMOS logic blocks, the first logic section is formed with n-channel transistors and the second logic section is formed with p-channel transistors and the outputs (A1 and A6) of the two logic sections are coupled to one another via transistors (8 and 10).

4 Claims, 2 Drawing Sheets

LOGIC CIRCUIT FOR ASYNCHRONOUS CIRCUITS WITH N-CHANNEL LOGIC BLOCK AND P-CHANNEL LOGIC BLOCK INVERSE THERETO

BACKGROUND OF THE INVENTION

The invention relates to a logic circuit with differential cascode voltage logic.

A logic circuit of this type is reproduced, for example, in the publication by T. Meng et al. entitled "Design of Clock-Free Asynchronous Systems for Real-Time Signal Processing" in the Digest of Technical Papers, pages 2532 to 2535 for the conference IEEE ICCAD 89. This circuit has a logic circuit with two logic blocks which are formed in each instance of n-channel transistors and in which circuit in each instance one part of a logic block is coupled back via an invertor with the gate of a precharging transistor connected to this logic block, in order in each instance to assure the output voltage of the logic blocks on a steady basis until such time as valid data cause a potential change at the output of the logic circuit.

The European Patent Application bearing the publication number 0,147,598 A1 discloses furthermore a system with differential cascode voltage switching logic, in which system a first logic block and a second logic block each have a switch, the switch of the first logic block always being closed when the switch of the second logic plug is open and vice versa, and the switch of the second logic plug being driven in a manner complementary to the switch of the first logic block.

SUMMARY OF THE INVENTION

The object of the invention is to provide a logic circuit for asynchronized circuits which offers a greater interference resistance and a lower power loss with the simultaneous use of conventional CMOS logic blocks.

According to the invention, this object is achieved by a logic circuit with differential cascode voltage logic in which a plurality of input lines are connected to a first logic block and also to a second logic block. Depending on signals on the input lines, either a first output of the first logic block is switched through to a second output of the first logic block, in this case a first output of the second logic block being separated from a second output of the second logic block, or the first output of the first logic block is separated from the second output of the first logic block, in this case the first output of the second logic block being switched through to the second output of the second logic block. The first output of the first logic block is connected to each first connection of a first transistor and a second transistor of a first pair of precharging transistors. The second output of the first logic block is connected to a first connection of a charging transistor. The first output of the second logic block is connected to each first connection of a first transistor and a second transistor of a second pair of precharging transistors. The second output of the second logic block is connected to a first connection of a charging transistor. A gate of the first transistor of the first pair of precharging transistors and a gate of the charging transistor connected to the first logic block is directly connected to a request input. At a first logic level at the request input only the transistors of the pairs of precharging transistors are conductive and all charging transistors which are present are non-conductive. At the second logic level at the request input only all charging transistors which are present are conductive and the transistors of the pairs of precharging transistors are non-conductive. A gate of the second transistor of the first pair of precharging transistors is connected to an output of a first feedback invertor. A gate of the second transistor of the second pair of precharging transistors is connected to an output of a second feedback invertor. The first output of the first logic block is connected to a first input of a logic link and the first output of the second logic block is connected to a second input of the logic link. An output of the logic link represents a complete message output. A second connection of the first transistor and second transistor of the first pair of precharging transistors has applied to it a supply voltage and a second connection of the charging transistor connected to the first logic block is set to reference potential.

The first logic block has transistors of a first channel type. The charging transistor connected to the first logic plug also possesses a first channel type and both the first transistor and the second transistor of the first pair of precharging transistors possess a second channel type. The second logic block has transistors, the channel type of which is the same as the channel type of the charging transistor connected to the second logic block and differs from the channel type of the first transistor and also of the second transistor of the second pair of precharging transistors.

An output of the first feedback invertor is connected to the first output of the first logic block. An input of the second feedback invertor is connected to the first output of the first logic block. A gate of the charging transistor connected to the second logic block and a gate of the first transistor of the second pair of precharging transistors are each connected via an invertor to the request input. The second logic block possesses a second channel type different from the first channel type of the first logic section. A second connection of the charging transistor connected to the second logic block is connected to the supply voltage and in each instance a second connection of the first and second precharging transistor of the second pair of precharging transistors are connected to reference potential.

In preferred embodiments of the present invention another output of the logic circuit is connected to the first output of the second logic block. The first logic block is constructed from n-channel transistors and the second logic block is constructed from p-channel transistors.

The advantage which can be achieved by the invention resides in particular in that in consequence of the mutual coupling of the two logic blocks no quadrature-axis currents can arise between supply voltage VDD and reference potential VSS and accordingly a substantially lower power loss is achieved.

BRIEF DESCRIPTION OF THE DRAWING

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DETAILED DESCRIPTION OF THE PREFERRED EMBODIMENT

Asynchronous or "self-timed" circuits are regarded as a circuitry principle of great significance for the future for the sub-$\mu$m range, since with the present conventional global cyclic drive in future highly complex and extremely fast circuits transit time problems (clock skew) arise in the clock supply, which limit a corresponding system in its dimensions and/or lead to a reduced processing speed. In the case of asynchronous circuits which communicate with one another in accordance with a "hand shake" process, these problems caused by a central clock are excluded.

As a basis for such asynchronous circuits, it is necessary to provide logic circuits which in response to a request signal execute a logic link and as soon as valid data are present at the output of the logic circuit, make available a complete message signal (completion) at a corresponding output of the logic circuit.

Figure 1:
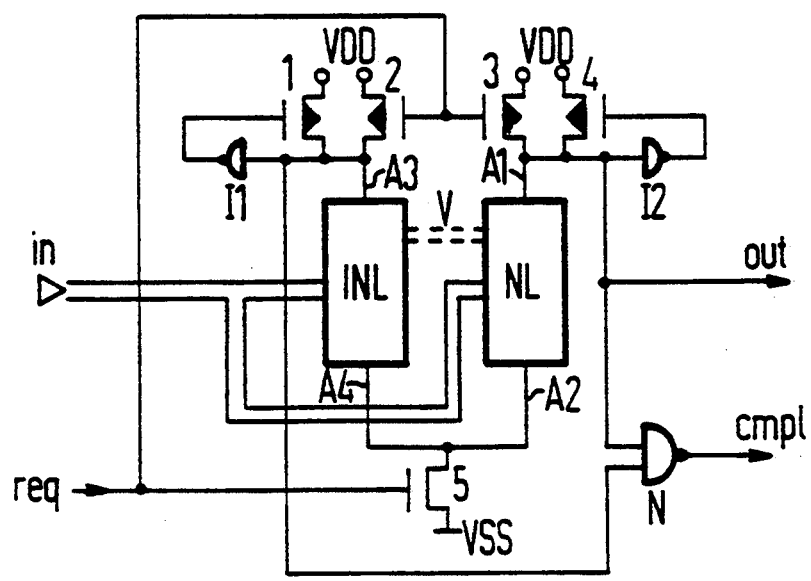
FIG. 1 shows an already known logic circuit for asynchronous circuits.

A logic circuit for asynchronous circuits is, as a rule, constructed according to FIG. 1 and is designated as differential cascode voltage switched logic (DCVSL). In the logic circuit shown in FIG. 1, a plurality of input lines (in) is connected both to a first logic block (NL) and also to a second logic block (INL), in which arrangement the second logic block INL is inverse to the first logic block NL. An output A1 of the logic block NL is connected to each connection of a transistor 3 and of a transistor 4 of a first pair of precharging transistors and an output A2 of the first logic block NL is connected to a connection of a charging transistor 5. An output A3 of the second logic block NL is connected to each connection of a transistor 1 and of a transistor 2 of a second pair of precharging transistors and an output A4 of the second logic block INL is, for reasons of economy, also connected to the charging transistor 5. A gate of the transistor 3 of the first pair of precharging transistors and a gate of the transistor 2 of the second pair of precharging transistors is directly connected to a request input req. A gate of the transistor 4 of the first pair of precharging transistors is connected to an output of a feedback invertor I2 and a gate of the transistor 1 of the second pair of precharging transistors is connected to an output of a feedback invertor I1. The output A1 of the first logic block NL is connected to a first input of a NAND link N and the output A3 of the second logic block INL is connected to a second input of the logic link N and an output of the NAND link represents a complete message output cmpl. Each second connection of the transistors 1 ... 4 of the first and second pairs of precharging transistors is connected to a supply voltage VDD and a second connection of the charging transistor 5 is connected to reference potential VSS. The first logic block NL and the charging transistor 5 have, in this case, transistors of a first channel type, for example n-channel transistors, and the two pairs of precharging transistors possess transistors of a second channel type, for example p-channel transistors. An output out is connected either to the first output A1 of the first logic block NL or to the first output A3 of the second logic block INL. Sections of the logic blocks NL and INL are possibly useable on a reciprocal basis; this is indicated by a connection V, shown by a dashed line, between the two logic blocks.

If in the known logic circuit designed according to FIG. 1 a low level is present at the request input req, then the logic circuit is at the passing stage and the transistors 2 and 3 of the first and second pairs of precharging transistors are conductive and the charging transistor 5 is non-conductive, whereby the two outputs A1 and A3 of the two logic blocks NL and INL receive in this case in each instance high levels and the complete message output cmpl receives low level. In order that the two outputs A1 and A2 are capable of being influenced only by the two logic blocks after a change of level at the request input req, the levels of the outputs A1 and A3 of the logic blocks are coupled back to the gates of the second transistors 1 and 4 respectively of the respective pair of precharging transistors via the invertors I1 and I2 respectively. If now the request input req receives high potential, therein the two transistors 2 and 3 of the two pairs of precharging transistors block and the two transistors 1 and 4 of the pairs of precharging transistors continue to conduct. Since at all times either the output A1 of the first logic block or the output A3 of the second logic block must be discharged to low level, a signal at the output out of the logic circuit is valid when a change in charge of one of the two outputs A1 or A3 has taken place. Strictly speaking, valid data at the output out of the logic circuit is present earlier by the transit time of the NAND link N than is indicated by the complete message signal cmpl. Since, on account of the feedback invertors I1 and I2, the transistors 1 and 4 are conductive until such time as valid data is present at the output of the logic circuit, quadrature-axis currents may flow, since the transistors of a logic block and the charging transistor 5 are simultaneously conductive.

Figure 3:
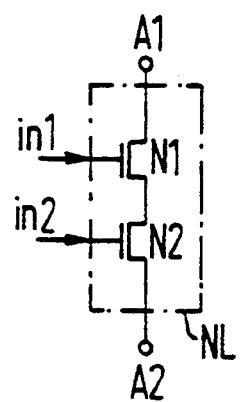
FIG. 3 shows an illustrative embodiment of a first logic block of a logic circuit which is known or according to the invention.
Figure 4:
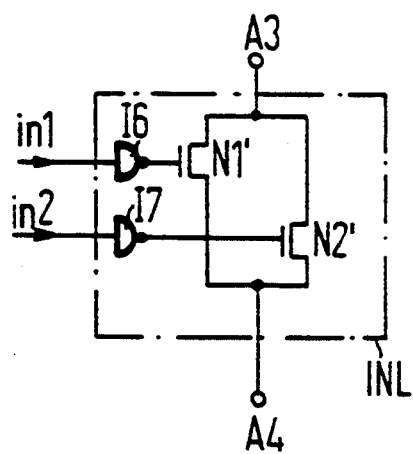
FIG. 4 shows a second logic block, suitable for the first logic block of FIG. 3, in the case of a known logic circuit

If, by way of example, as shown in FIG. 3, the first logic block has two n-channel transistors N1 and N2, which are connected in series and the gates of which are directly connected to inputs in1 and in2 respectively of the logic circuit, then the first logic block NL represents an AND link, which executes a NAND link on account of the total circuit at the output out of the logic circuit. The NAND circuit, which is inverse to the first logic block, of the second logic block is, as shown in FIG. 4, executable in n-channel technology as an OR link with inverted inputs. In this case, the two transistors N1' and N2' are connected in parallel and their gates are connected in each instance via invertors 16 and 17 to inputs in1 and in2 respectively of the logic circuit.

Figure 2:
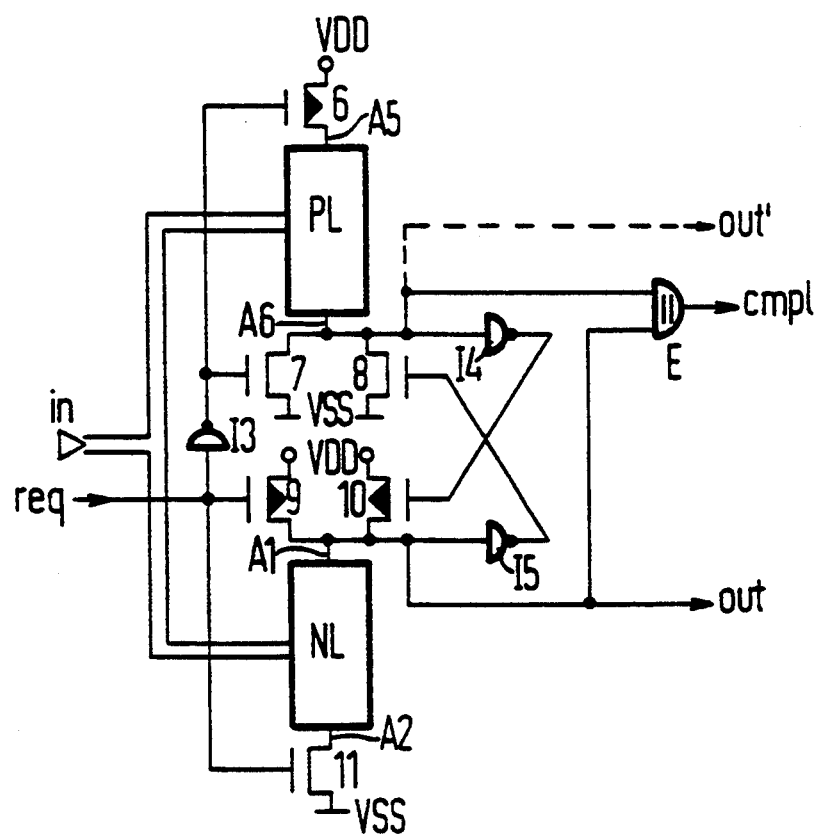
FIG. 2 shows a logic circuit according to the invention for asynchronous circuits.

FIG. 2 shows a logic circuit, according to the invention, for asynchronous circuits, in which logic circuit only one first logic block NL has n-channel transistors and a second logic block PL has p-channel transistors. Both the first logic block and the second logic block are, as in the logic circuit of FIG. 1, connected to inputs in the logic circuit. The first logic block NL is connected at an output A1 both via a transistor 9 and via a transistor 10 of a first pair of precharging transistors, to the supply voltage VDD and, at an output A2, via a charging transistor 11, to reference potential VSS. In a corresponding manner, the second logic block PL is connected at an output A6, via a transistor 7 and a transistor 8 of a pair of precharging transistors, to reference potential VSS and, at an output A5, via a charging transistor 6, to the supply voltage VDD. In this case, the transistors 6, 9 and 10 are p-channel transistors, and the transistors 7, 8 and 11 are n-channel transistors. A request input req of the logic circuit is directly connected to a gate of the transistor 9 of the first pair of precharging transistors and to a gate of the charging transistor 11 as well as indirectly via an invertor I3, to a gate of the transistor 7 of a second pair of precharging transistors and to a gate of the charging transistor 6. The output A1 of the first logic block NL is connected via an invertor I5, to a gate of the transistor 8 of the second pair of precharging transistors and the output A6 is connected via an invertor I4 to a gate of the transistor 10 of the first pair of precharging transistors. An equivalence link E is connected, on the input side, to the output A1 of the logic block NL and to the output A6 of the logic block PL, as well as, on the output side, to a complete message out cmpl of the logic circuit. The output A1 of the logic block NL can be passed out as output out of the logic circuit and/or the output A6 of the logic block PL can, as indicated in broken lines in the figure, be passed out as output out'of the logic circuit.

If low potential is present at the request input req of the logic circuit, then both charging transistors 6 and 11 are non-conductive and the two transistors 7 and 9 of the two pairs of precharging transistors are conductive. The output A1 of the logic block NL and the output out of the logic circuit as well as an input of the equivalence link A receive high levels, as against which the output A6 of the logic block PL and the second input of the equivalence link A receive low levels and thus the complete message output cmpl of the logic circuit assumes low levels, since there is no equivalence. The two transistors 8 and 10 of the two pairs of precharging transistors are in each instance reciprocally non-conductive. If now high potential is applied at the request input req of the logic circuit, then the transistors 7 and 9 of the two pairs of precharging transistors are non-conductive and the two charging transistors 8 and 10 remain non-conductive as a result of the reciprocal coupling via the invertors I4 and I5, whereby an occurrence of quadrature-axis currents is avoided. Since the two logic blocks are inverse to one another, one of the two outputs A1 and A6 will retain its precharging level and the other output will change its precharging level. In this case, it is locked on a steady basis to the precharging level of the respective other output, via the invertor I4 or I5 connected to it and the transistor 10 or 8. If the change of the precharging level at an output has been completed, then both outputs A1 and A6 have the same level and at the complete message output cmpl of the logic circuit high potential indicates valid data at the output out of the logic circuit.

Figure 5:
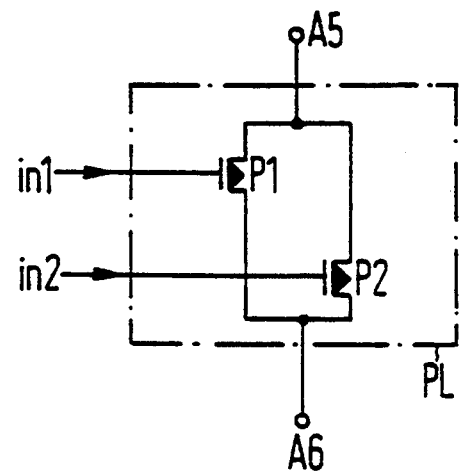
FIG. 5 shows a second logic block, suitable for the first logic block of FIG. 3, in the case of a logic circuit according to the invention.

If again, as described in the introduction, the AND circuit shown in FIG. 3 and having the two transistors N1 and N2 is employed for the logic block NL, then an OR circuit shown in FIG. 5 and having a parallel circuit of two p-channel transistors P1 and P2 is to be selected for the logic block PL. The parallel circuit of the two p-channel transistors P1 and P2 lies between the outputs A5 and A6 and the gate of the transistor P1 is connected to an input in1 of the logic circuit and the gate of the transistor P2 is connected to an input in2 of the logical circuit. As also becomes clear from the example of FIG. 4 and FIG. 5, in the case of the logic circuit according to the invention, in contrast to the known logic circuit, a series of invertors, for example I6 and I7, can be saved and thereby the slight additional complexity of an equivalence gate E, especially in the case of relatively large logic blocks, is frequently more than compensated. A reciprocal utilization of sections of the two logic blocks NL and PL, as expressed in FIG. 1 by the link V, is also feasible.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A logic circuit with differential cascode voltage logic in which a plurality of input lines are connected to a first logic block and also to a second logic block, wherein depending on signals on the input lines, either a first output of the first logic block is switched through to a second output of the first logic block, in this case a first output of the second logic block being separated from a second output of the second logic block, or the first output of the first logic block is separated from the second output of the first logic block, in this case the first output of the second logic block being switched through to the second output of the second logic block, comprising:

the first output of the first logic block connected to each first connection of a first transistor and a second transistor of a first pair of precharging transistors and the second output of the first logic block connected to a first connection of a charging transistor;

the first output of the second logic block connected to each first connection of a first transistor and a second transistor of a second pair of precharging transistors and the second output of the second logic block connected to a first connection of a charging transistor;

a gate of the first transistor of the first pair of precharging transistors and a gate of the charging transistor connected to the first logic block each directly connected to a request input;

wherein at a first logic level at the request input only the transistors of the pairs of precharging transistors are conductive and all charging transistors are non-conductive and at a second logic level at the request input only all charging transistors are conductive and the transistors of the pairs of precharging transistors are non-conductive;

a gate of the second transistor of the first pair of precharging transistors connected to an output of a first feedback invertor;

a gate of the second transistor of the second pair of precharging transistors connected to an output of a second feedback invertor;

the first output of the first logic block connected to a first input of a logic link and the first output of the second logic block connected to a second input of the logic link, and an output of the logic link being a complete message output;

each second connection of the first transistor and the second transistor of the first pair of precharging transistors having applied thereto a supply voltage and a second connection of the charging transistor that is connected to the first logic block being set to a reference potential;

the first logic block having transistors of a first channel type, the charging transistor that is connected to the first logic block also being of a first channel type, and the first transistor and also the second transistor of the first pair of precharging transistors being of a second channel type;

the second logic block having transistors, the channel type of which is the same as the channel type of the charging transistor that is connected to the second logic block and differs both from the channel type of the first transistor and also of the second transistor of the second pair of precharging transistors;

an input of the first feedback invertor connected to the first output of the second logic block;

an input of the second feedback invertor connected to the first output of the first logic block;

a gate of the charging transistor that is connected to the second logic block and a gate of the first transistor of the second pair of precharging transistors connected via an invertor to the request input;

the second logic block having a second channel type that is different from the first channel type of the first logic section;

a second connection of the charging transistor that is connected to the second logic block connected to the supply voltage and each second connection of the first and second precharging transistor of the second pair of precharging transistors connected to the reference potential.

2. The logic circuit as claimed in claim 1, wherein an output of the logic circuit is connected to the first output of the first logic block.

3. The logic circuit as claimed in claim 1, wherein an output of the logic circuit is connected to the first output of the second logic block.

4. The logic circuit as claimed in 1, wherein the first logic block is constructed from n-channel transistors and the second logic block is constructed from p-channel transistors.

* * * * *